(12) United States Patent
Kim et al.

(10) Patent No.: US 12,286,564 B2
(45) Date of Patent: Apr. 29, 2025

(54) ADHESIVE COMPOSITION FOR SEMICONDUCTOR CIRCUIT CONNECTION, ADHESIVE FILM FOR SEMICONDUCTOR, METHOD FOR MANUFACTURING SEMICONDUCTOR PACKAGE, AND SEMICONDUCTOR PACKAGE USING THE SAME

(71) Applicant: LG CHEM, LTD., Seoul (KR)

(72) Inventors: Youngsam Kim, Daejeon (KR); You Jin Kyung, Daejeon (KR); Kwang Joo Lee, Daejeon (KR); Minsu Jeong, Daejeon (KR); Junghak Kim, Daejeon (KR); Ju Hyeon Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 991 days.

(21) Appl. No.: 17/266,864

(22) PCT Filed: May 8, 2020

(86) PCT No.: PCT/KR2020/006100
§ 371 (c)(1),
(2) Date: Feb. 8, 2021

(87) PCT Pub. No.: WO2020/231101
PCT Pub. Date: Nov. 19, 2020

(65) Prior Publication Data
US 2021/0292618 A1    Sep. 23, 2021

(30) Foreign Application Priority Data

May 10, 2019  (KR) .......................... 10-2019-0055222
May 7, 2020   (KR) .......................... 10-2020-0054681

(51) Int. Cl.
| C09J 163/04 | (2006.01) |
| C09J 7/10   | (2018.01) |
| C09J 11/04  | (2006.01) |
| C09J 11/08  | (2006.01) |
| H01L 23/00  | (2006.01) |

(52) U.S. Cl.
CPC ............... *C09J 163/04* (2013.01); *C09J 7/10* (2018.01); *C09J 11/04* (2013.01); *C09J 11/08* (2013.01); *H01L 24/29* (2013.01); *H01L 24/83* (2013.01); *C09J 2433/00* (2013.01); *C09J 2463/00* (2013.01); *H01L 2224/2919* (2013.01); *H01L 2224/83203* (2013.01)

(58) Field of Classification Search
CPC ... C09J 163/04; C09J 7/10; C09J 11/04; C09J 11/08; H01L 24/29; H01L 24/83
See application file for complete search history.

(56) References Cited

U.S. PATENT DOCUMENTS

| 5,117,004 A     | 5/1992  | Kempe et al.  |
| 8,623,942 B2    | 1/2014  | Kaneko et al. |
| 8,735,529 B2    | 5/2014  | Kaneko et al. |
| 9,023,956 B2    | 5/2015  | Kaneko et al. |
| 2010/0022744 A1 | 1/2010  | Kaneko et al. |
| 2010/0308477 A1 | 12/2010 | Akizuki et al.|
| 2012/0004349 A1 | 1/2012  | Kaneko et al. |
| 2012/0004377 A1 | 1/2012  | Kaneko et al. |
| 2013/0101863 A1 | 4/2013  | Mabuchi et al.|
| 2021/0009867 A1 | 1/2021  | Kim et al.    |

FOREIGN PATENT DOCUMENTS

| JP | 2004-217559 A  | 8/2004  |
| JP | 2010-280804 A  | 12/2010 |
| JP | 2011-225840 A  | 11/2011 |
| JP | 5459873 B2     | 4/2014  |
| JP | 2018-145346 A  | 9/2018  |
| JP | 2018-148124 A  | 9/2018  |
| JP | 2021-512197 A  | 5/2021  |
| KR | 10-2007-0035179 A | 3/2007 |
| KR | 10-2009-0079998 A | 7/2009 |
| KR | 10-2010-0079510 A | 7/2010 |
| KR | 10-2010-0130966 A | 12/2010 |
| KR | 10-1176809 B1  | 8/2012  |
| KR | 10-1279967 B1  | 7/2013  |
| KR | 10-1349996 B1  | 1/2014  |
| WO | 2010-106780 A1 | 9/2010  |
| WO | 2011-132674 A1 | 10/2011 |

OTHER PUBLICATIONS

English machine translation of JP 2011-225840A. (Year: 2011).*
International Search Report issued for International Application No. PCT/KR2020/006100 on Aug. 24, 2020, 4 pages.

* cited by examiner

*Primary Examiner* — John E Uselding
(74) *Attorney, Agent, or Firm* — ROTHWELL, FIGG, ERNST & MANBECK, P.C.

(57) ABSTRACT

The present disclosure relates to a resin composition for semiconductor adhesion comprising: a thermoplastic resin; a thermosetting resin; a curing agent; and a curing catalyst compound having a specific structure, and an adhesive film for semiconductor, a method for manufacturing a semiconductor package, and a semiconductor package using the same.

12 Claims, No Drawings

ADHESIVE COMPOSITION FOR SEMICONDUCTOR CIRCUIT CONNECTION, ADHESIVE FILM FOR SEMICONDUCTOR, METHOD FOR MANUFACTURING SEMICONDUCTOR PACKAGE, AND SEMICONDUCTOR PACKAGE USING THE SAME

TECHNICAL FIELD

Cross-Reference with Related Application(s)

This application is a 35 U.S.C. 371 National Phase Entry Application from PCT/KR2020/006100, filed on May 8, 2020, designating the United States, which claims the benefit of Korean Patent Application No. 10-2019-0055222 filed on May 10, 2019 and Korean Patent Application No. 10-2020-0054681 filed on May 7, 2020 in the Korean Intellectual Property Office, the disclosures of which are incorporated herein by reference in their entity.

The present disclosure relates to an adhesive composition for semiconductor circuit connection, and an adhesive film for semiconductor, a method for manufacturing a semiconductor package, and a semiconductor package using the same.

BACKGROUND OF THE INVENTION

Recently, as the tendency toward miniaturization, high functionalization, and capacity enlargement of electronic equipment has been expanding and the need for densification and high integration of the semiconductor package has rapidly increased, the size of semiconductor chips becoming larger and larger. In terms of improvement of integration degree, the stack package method for laminating chips in multi-stages has gradually increased.

In addition, recently, a semiconductor using a through silicon via (TSV) has been developed, and signal transmission through bump bonding has been performed. For such bump bonding, thermal compression bonding technology is mainly applied. At this time, the heat curing property of the adhesive in the thermal compression bonding technology affects the package manufacturing processability and package reliability.

A non-conductive paste (NCP) in the form of a paste has been developed as an adhesive for filling between respective TSV layers, but there was a problem that the pitch of the bumps became narrower and the filling became more difficult. In order to overcome these problems, a non-conductive film (NCF) provided in the form of a film has been developed.

During thermal compression bonding for bump bonding, the adhesive must be cured rapidly at high temperatures, curing must be suppressed at room temperature and storage stability should be good. In such adhesives, catalysts play an important role in adjusting the curing degree, and a thermally-latent catalyst for this purpose has been developed.

BRIEF SUMMARY OF THE INVENTION

The present disclosure provides an adhesive composition for semiconductor circuit connection that has excellent storage stability at room temperature while being curable within a short time at high temperature during a thermo-compression bonding.

The present disclosure also provides an adhesive film comprising the above-mentioned adhesive composition for semiconductor circuit connection.

The present disclosure further provides a method for manufacturing a semiconductor package using the above-mentioned adhesive film.

The present disclosure further provides a semiconductor package using the above-mentioned adhesive film.

Provided herein is a resin composition for semiconductor adhesion comprising: a thermoplastic resin; a thermosetting resin; a curing agent; and a curing catalyst represented by the following Chemical Formula 1.

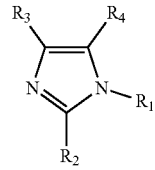

[Chemical Formula 1]

in the Chemical Formula 1, $R_1$ is one of hydrogen, an alkyl group having 1 to 10 carbon atoms, or an aryl group having 6 to 30 carbon atoms, $R_2$ is a functional group represented by the following Chemical Formula 2, at least one of $R_3$ and $R_4$ is an electron withdrawing functional group, and the rest are one of hydrogen, an alkyl group having 1 to 10 carbon atoms, an aryl group having 6 to 30 carbon atoms, or an alkoxy group having 1 to 10 carbon atoms,

[Chemical Formula 2]

in the Chemical Formula 2, $R_5$ may be one of hydrogen, a hydroxy group, an amino group, a halogen group, an alkyl group having 1 to 10 carbon atoms, a cycloalkyl group having 3 to 8 carbon atoms, a heterocycloalkyl group having 2 to 8 carbon atoms, an aryl group having 6 to 30 carbon atoms, a heteroaryl group having 6 to 30 carbon atoms, or an alkoxy group having 1 to 10 carbon atoms.

Also provided herein is an adhesive film for semiconductor comprising a cured product of the above-mentioned resin composition for semiconductor adhesion.

Further provided herein is a method for manufacturing a semiconductor package comprising the step of subjecting a substrate on which an adhesive film for a semiconductor is laminated; and a semiconductor substrate to thermo-compression bonding.

DETAILED DESCRIPTION OF THE INVENTION

Hereinafter, an adhesive composition for semiconductor circuit connection, an adhesive film and a method for manufacturing a semiconductor package according to specific embodiments of the present disclosure will be described in more detail.

Unless expressly stated herein, the technical terms are only for describing specific exemplary embodiments and are not intended to limit the present disclosure.

The singular forms "a", "an", and "the" used herein include plural references unless the context clearly dictates otherwise.

It should be understood that the terms "comprise", "include" and the like used herein are intended to specify certain features, regions, integers, steps, operations, elements and/or components, and these do not preclude the possibility of existence or addition of other features, integers, steps, operations, elements, components and/or groups.

The terms including ordinal numbers such as "a first", "a second", etc. are used only for the purpose of distinguishing one component from another component, and are not limited by the ordinal numbers. For instance, a first component may be referred to as a second component, or similarly, the second component may be referred to as the first component, without departing from the scope of the present disclosure.

As used herein, the weight average molecular weight was measured as follows: Aters Alliance 2695 instrument equipped with Agilent Mixed B Column is used, the evaluation temperature is 40° C., the solvent is tetrahydrofuran, the flow rate is 1.0 mL/min, a sample is prepared at a concentration of 1 mg/10 mL and then fed in an amount of 100 µL, and the value of Mw is determined using calibration curves formed from a polystyrene standard. The molecular weight of the polystyrene standards is nine kinds of 2,000/10,000/30,000 /70,000/200,000/700,000/2,000,000/4,000,000/10,000,000.

As used herein, the term "substituted" means that other functional groups instead of a hydrogen atom in the compound are bonded, and a position to be substituted is not limited as long as it is a position at which the hydrogen atom is substituted, that is, a position at which it is substitutable with the substituent. When two or more substituents are substituted, the two or more substituents may be identical to or different from each other.

As used herein, the term "substituted or unsubstituted" means being unsubstituted or substituted with one or more substituents selected from the group consisting of deuterium; a halogen group; a cyano group; a nitro group; a hydroxy group; a carbonyl group; an ester group; an imide group; an amide group; a primary amino group; a carboxy group; a sulfonic acid group; a sulfonamide group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkoxysilylalkyl group; an arylphosphine group; or a heterocyclic group containing at least one of N, O and S atoms, or being unsubstituted or substituted with a substituent to which two or more substituents are linked among the substituents exemplified above. For example, "the substituent to which two or more substituents are linked" may be a biphenyl group. That is, the biphenyl group may also be an aryl group, and may also interpreted as a substituent to which two phenyl groups are linked.

In the present disclosure, a multivalent functional group is a residue in which a plurality of hydrogen atoms bonding to an arbitrary compound are removed, and for example, it may be a divalent functional group, a trivalent functional group, and a tetravalent functional group. As an example, a tetravalent functional group derived from a cyclobutane means a residue in which any four hydrogen atoms bonded to cyclobutane are removed.

In the present disclosure, examples of a halogen may be fluorine, chlorine, bromine or iodine.

In the present disclosure, the alkyl group is a monovalent functional group derived from an alkane, and may be a straight-chain or a branched-chain. The number of carbon atoms of the straight chain alkyl group is not particularly limited, but is preferably 1 to 20. Also, the number of carbon atoms of the branched chain alkyl group is 3 to 20. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, iso-pentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, 2,6-dimethylheptane-4-yl and the like, but are not limited thereto. The alkyl group may be substituted or unsubstituted.

In the present disclosure, the haloalkyl group means a functional group in which the above-described alkyl group is substituted by a halogen group, and examples of halogen group are fluorine, chlorine, bromine or iodine. The haloalkyl group may be substituted or unsubstituted.

In the present disclosure, an aryl group is a monovalent functional group derived from an arene, and may be a monocyclic aryl group or a polycyclic aryl group. The monocyclic aryl group may be a phenyl group, a biphenyl group, a terphenyl group or the like, but is not limited thereto. The polycyclic aryl group may be a naphthyl group, an anthracenyl group, a phenanthryl group, a pyrenyl group, a perylenyl group, a chrysenyl group and a fluorenyl group or the like, but is not limited thereto. The aryl group may be substituted or unsubstituted.

In the present disclosure, the notation $\frac{1}{2}$, or $\frac{1}{2}$ means a bond linked to another substituent group.

In the present disclosure, a direct bond or a single bond means being connected to a bond line win which no atoms or atomic groups exist at the corresponding position.

I. Resin Composition for Semiconductor Adhesion

According to one embodiment of the present disclosure, there may be provided a resin composition for semiconductor adhesion comprising: a thermoplastic resin; a thermosetting resin; a curing agent; and a curing catalyst represented by Chemical Formula 1.

The present inventors have conducted research on components that can be used for the bonding or packaging of semiconductor devices, and have found through experiments that when a compound of Chemical Formula 1 is included as in the resin composition for semiconductor adhesion according to one embodiment, it has excellent storage stability at room temperature while being curable within a short time at high temperature during a thermo-compression bonding in the process of manufacturing a semiconductor package, as compared with a conventional resin composition for semiconductor package. The present disclosure has been completed on the basis of these findings.

Specifically, as represented by $R_2$ in Chemical Formula 1, as the function group represented by Chemical Formula 2 is substituted in the imidazole compound, not only the nucleophilicity of the nitrogen atom containing the unshared electron pair of the imidazole compound is reduced, but also steric hindrance may be induced by the function group represented by Chemical Formula 2.

That is, the curing reaction can be delayed through deactivation of the catalyst at room temperature, and the catalyst is activated at a temperature higher than the curing temperature during thermo-compression bonding, so that the resin composition for semiconductor adhesion of the embodiment can have the characteristic of rapidly curing at high temperature and the long-term storage stability at room temperature.

In addition, an unsubstituted imidazole compound or an imidazole compound in which only hydrocarbon and/or halogen groups are substituted, which has been widely used in the prior art, starts to cure at about 150° C., which causes a technical problem that it is difficult to control the curing degree. On the other hand, since the resin composition for semiconductor adhesion according to one embodiment of the present disclosure includes a compound in which at least one functional group containing a carbonyl group is bonded as shown in Chemical Formula 2, not only the nucleophilicity of an unshared electron pair can be more reduced, but also a bulky structure can be formed, as compared with an unsubstituted imidazole compound or an imidazole compound in which only hydrocarbon and/or halogen groups are substituted, which has been widely used in the prior art, whereby the reactivity of the compound of Chemical Formula 1 is reduced, and thus, at room temperature, the reaction rate is delayed to further increase the storage stability improvement effect, and at a temperature of 200° C. or higher, curing rapidly progresses, and the processability and package reliability can be significantly increased in the manufacture of a semiconductor package.

In more detail, looking at the resin composition for semiconductor adhesion of one embodiment, in Chemical Formula 1, $R_1$ is one of hydrogen, an alkyl group having 1 to 10 carbon atoms, or an aryl group having 6 to 30 carbon atoms, $R_2$ is a functional group represented by Chemical Formula 2, at least one of $R_3$ and $R_a$ is an electron withdrawing functional group, and the rest may be one of hydrogen, an alkyl group having 1 to 10 carbon atoms, an aryl group having 6 to 30 carbon atoms, or an alkoxy group having 1 to 10 carbon atoms.

As the functional group represented by Chemical Formula 2 includes a —(C=O)— bond, it may act as an electron withdrawing group. That is, as the compound of Chemical Formula 1 is substituted with a functional group represented by Chemical Formula 2, the nucleophilicity possessed by the unshared electron pair of the nitrogen atom contained in the compound of Chemical Formula 1 is reduced, so that the resin composition for semiconductor adhesion of the embodiment containing the compound of Chemical Formula 1 has a delayed reaction rate at room temperature, thereby having excellent storage stability and high curing temperature.

In addition, as the functional group represented by Chemical Formula 2 includes a —(C=O)— bond, it can form a bulky structure as compared with an electron withdrawing functional group such as a halogen that has been widely used in the related art, whereby the resin composition for semiconductor adhesion of one embodiment comprising the compound of Chemical Formula 1 has a delayed reaction rate at room temperature, and so excellent storage stability, package manufacturing processability and package reliability can be realized.

According to an embodiment of the present disclosure, $R_1$ in Chemical Formula 1 may be hydrogen.

When $R_1$ in Chemical Formula 1 is hydrogen, the curing catalyst represented by Chemical Formula 1 may have the following resonance structure by tautomerization.

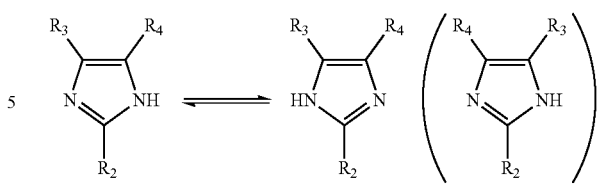

That is, when $R_1$ in Chemical Formula 1 is hydrogen and thus, the curing catalyst represented by Chemical Formula 1 has the above-mentioned resonance structure by tautomerization, $R_3$ and $R_4$ in Chemical Formula 1 have the same chemical position, and may have no regioselectivity.

According to an embodiment of the present disclosure, $R_2$ in Chemical Formula 1 may be a functional group represented by Chemical Formula 2.

As the functional group represented by Chemical Formula 2 is bonded to the position of $R_2$ in the imidazole compound, the role as an electron withdrawal is effectively implemented due to the adjacent positional characteristics that can affect both functional groups regardless of tautomerization, and thus, the nucleophilicity possessed by the unshared electron pair of the nitrogen atom contained in the compound of Chemical Formula 1 can be reduced. Thereby, the resin composition for semiconductor adhesion of one embodiment comprising the compound of Chemical Formula 1 can have a delayed reaction rate at room temperature and thus has excellent storage stability and high curing temperature.

According to an embodiment of the present disclosure, at least one of $R_3$ and $R_4$ in Chemical Formula 1 is an electron withdrawing functional group, and the rest may be one of hydrogen, an alkyl group having 1 to 10 carbon atoms, an aryl group having 6 to 30 carbon atoms, or an alkoxy group having 1 to 10 carbon atoms.

Since at least one of $R_3$ and $R_4$ in Chemical Formula 1 is an electron withdrawing functional group, in the curing catalyst represented by Chemical Formula 1, at least one electron withdrawing functional group may be further substituted in addition to the functional group represented by Chemical Formula 2. Thereby, the nucleophilicity of the nitrogen atom containing an unshared electron pair of the imidazole compound is reduced, and the curing reaction can be delayed through deactivation of the catalyst at room temperature.

In accordance with another embodiment of the present disclosure, since $R_1$ in Chemical Formula 1 is hydrogen, and one of $R_3$ and $R_4$ in Chemical Formula 1 is an electron withdrawing group, in the curing catalyst represented by Chemical Formula 1, electron withdrawing functional groups may be substituted on the second carbon and the fifth carbon of the imidazole compound.

Specifically, one of $R_3$ and $R_4$ in Chemical Formula 1 is an electron withdrawing functional group, and the other one may be one of hydrogen, an alkyl group having 1 to 10 carbon atoms, an aryl group having 6 to 30 carbon atoms, or an alkoxy group having 1 to 10 carbon atoms, That is, in the curing catalyst represented by Chemical Formula 1, two electron withdrawing functional group including the functional group represented by Chemical Formula 2 may be substituted. Consequently, the nucleophilicity of the nitrogen atom containing an unshared electron pair of the imidazole compound is reduced, and the curing reaction can be delayed through deactivation of the catalyst at room temperature.

On the other hand, when both $R_3$ and $R_4$ are substituted with an electron withdrawing functional group, the reactivity of the curing catalyst represented by Chemical Formula 1 is excessively reduced, so that curing is not sufficiently proceeded even at 200° C. or higher, and thus, the package manufacturing processability and package reliability can be reduced.

Alternatively, when $R_1$ in Chemical Formula 1 is not hydrogen, $R_3$ and $R_4$ have different chemical positions even if the curing catalyst represented by Chemical Formula 1 is tautomerized. That is, in one embodiment of the present disclosure, when $R_1$ in Chemical Formula 1 is not hydrogen, $R_4$ in Chemical Formula 1 is an electron withdrawing functional group, and $R_3$ may be one of hydrogen, an alkyl group having 1 to 10 carbon atoms, an aryl group having 6 to 30 carbon atoms, or an alkoxy group having 1 to 10 carbon atoms.

Meanwhile, in Chemical Formula 1, the electron withdrawing functional group may be one of a functional group represented by Chemical Formula 2, a halogen group, a haloalkyl group having 1 to 10 carbon atoms, a nitro group, a cyano group, a sulfonyl group, or a sulfonic acid group.

That is, at least one of $R_3$ and $R_4$ in Chemical Formula 1 is one of a functional group represented by Chemical Formula 2, a halogen group, a haloalkyl group having 1 to 10 carbon atoms, a nitro group, a cyano group, a sulfonyl group, or a sulfonic acid group, and the rest may be one of hydrogen, an alkyl group having 1 to 10 carbon atoms, an aryl group having 6 to 30 carbon atoms, or an alkoxy group having 1 to 10 carbon atoms, More specifically, one of $R_3$ and $R_4$ in Chemical Formula 1 is one of a functional group represented by Chemical Formula 2, a halogen group, a haloalkyl group having 1 to 10 carbon atoms, a nitro group, a cyano group, a sulfonyl group, or a sulfonic acid group, and the other one may be one of hydrogen, an alkyl group having 1 to 10 carbon atoms, an aryl group having 6 to 30 carbon atoms, or an alkoxy group having 1 to 10 carbon atoms.

Thereby, the curing catalyst represented by Chemical Formula 1 is substituted with two electron withdrawing functional groups, and at least one of them may be a functional group represented by Chemical Formula 2.

According to an embodiment of the present disclosure, since $R_5$ in Chemical Formula 2 is one of hydrogen, a hydroxy group, an amino group, a halogen group, an alkyl group having 1 to 10 carbon atoms, a cycloalkyl group having 3 to 8 carbon atoms, a heterocycloalkyl group having 2 to 8 carbon atoms, an aryl group having 6 to 30 carbon atoms, a heteroaryl group having 6 to 30 carbon atoms, and an alkoxy group having 1 to 10 carbon atoms, the functional group represented by Chemical Formula 2 may be one of a formyl group, a carboxylic acid group, an amide group, an acyl group, a ketonyl group, and an ester group.

Preferably, $R_5$ in Chemical Formula 2 may be one of hydrogen, a hydroxy group, and an alkoxy group having 1 to 10 carbon atoms, whereby the functional group represented by Chemical Formula 2 may be one of a formyl group, a carboxylic acid group, and an ester group.

More specifically, the curing catalyst represented by Chemical Formula 1 may include a compound represented by the following Chemical Formula 3.

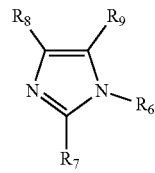

[Chemical Formula 3]

in the Chemical Formula 3, $R_6$ is one of hydrogen, an alkyl group having 1 to 10 carbon atoms, or an aryl group having 6 to 30 carbon atoms, $R_7$ is one of a formyl group, a carboxylic acid group, an amide group having 1 to 10 carbon atoms, an acyl group having 1 to 10 carbon atoms, a ketonyl group having 1 to 10 carbon atoms, or an ester group having 1 to 10 carbon atoms, one of $R_8$ and $R_9$ is one of a formyl group, a carboxylic acid group, an amide group having 1 to 10 carbon atoms, an acyl group having 1 to 10 carbon atoms, a ketonyl group having 1 to 10 carbon atoms, an ester group having 1 to 10 carbon atoms, a halogen group, a haloalkyl group having 1 to 10 carbon atoms, a nitro group, a cyano group, a sulfonyl group or a sulfonic acid group, and the other one is one of hydrogen, an alkyl group having 1 to 10 carbon atoms, an aryl group having 6 to 30 carbon atoms, or an alkoxy group having 1 to 10 carbon atoms.

Specifically, as represented by $R_7$ in Chemical Formula 3, as the imidazole compound is substituted with one of a formyl group, a carboxylic acid group, an amide group having 1 to 10 carbon atoms, an acyl group having 1 to 10 carbon atoms, a ketonyl group having 1 to 10 carbon atoms, or an ester group having 1 to 10 carbon atoms, not only the nucleophilicity of the nitrogen atom containing the unshared electron pair of the imidazole compound is reduced, but also steric hindrance can be induced by the functional group represented by Chemical Formula 2.

That is, at room temperature, the curing reaction may be delayed through deactivation of the catalyst, and at high temperatures above the curing temperature, the catalyst is activated during thermo-compression bonding, whereby the resin composition for semiconductor adhesion of the embodiment may have a characteristic of rapidly curing at a high temperature and a long-term storage stability at room temperature.

Further, an unsubstituted imidazole compound or an imidazole compound in which only hydrocarbon and/or halogen groups are substituted, which has been widely used in the prior art, starts to cure at about 150° C., which causes a technical problem that it is difficult to control the curing degree. On the other hand, since the resin composition for semiconductor adhesion according to one embodiment of the present disclosure includes a compound in which at least one functional group containing a carbonyl group is bonded similarly to $R_7$ in Chemical Formula 3, not only the nucleophilicity of an unshared electron pair is more reduced, but also a bulky structure can be formed, as compared with an unsubstituted imidazole compound or an imidazole compound in which only hydrocarbon and/or halogen groups are substituted, which has been widely used in the prior art, whereby the reactivity of the compound of Chemical Formula 1 is reduced, and thus, at room temperature, the reaction rate can be delayed to further increase the storage stability improving effect, and at a temperature of 200° C. or higher, curing rapidly progresses, and the processability and package reliability may be significantly increased in the manufacture of a semiconductor package.

As $R_7$ in Chemical Formula 3 includes a —(C=O)— bond, it may act as an electron withdrawing group. That is, as the curing catalyst of Chemical Formula 3 is substituted with a functional group containing a —(C=O)— bond, the nucleophilicity possessed by an unshared electron pair of the nitrogen atom is reduced, whereby the resin composition for semiconductor adhesion of one embodiment including the curing catalyst of Chemical Formula 3 has a delayed reaction rate at room temperature, and thus has excellent storage stability and high curing temperature.

Moreover, as $R_7$ in Chemical Formula 3 includes a —(C=O)— bond, it can form a bulky structure, compared to an electron withdrawing functional group such as a halogen group that has been widely used in the prior art, whereby the resin composition for semiconductor adhesion of the embodiment including the curing catalyst of Chemical Formula 3 has a delayed reaction rate at room temperature, and can realize excellent storage stability, package manufacturing processability, and package reliability.

According to an embodiment of the present disclosure, $R_6$ in Chemical Formula 3 may be hydrogen.

The effects resulting from the case where $R_6$ in Chemical Formula 3 is hydrogen are the same as described above for $R_1$ in Chemical Formula 1. That is, as the functional group containing the —(C=O)— bond is bonded to the position of $R_7$ in the imidazole compound, the role as an electron withdrawal is effectively implemented due to the adjacent positional characteristics that can affect both functional groups regardless of tautomerization, and thus, the nucleophilicity possessed by an unshared electron pair of the nitrogen atom contained in the compound of Chemical Formula 3 can be reduced. Thereby, the resin composition for semiconductor adhesion of one embodiment comprising the compound of Chemical Formula 3 can have a delayed reaction rate at room temperature and thus has excellent storage stability and high curing temperature.

According to one embodiment of the present disclosure, one of $R_8$ and $R_9$ in Chemical Formula 3 is one of a formyl group, a carboxylic acid group, an amide group having 1 to 10 carbon atoms, an acyl group having 1 to 10 carbon atoms, a ketonyl group having 1 to 10 carbon atoms, an ester group having 1 to 10 carbon atoms, a halogen group, a haloalkyl group having 1 to 10 carbon atoms, a nitro group, a cyano group, a sulfonyl group or a sulfonic acid group, and the other one may be one of hydrogen, an alkyl group having 1 to 10 carbon atoms, an aryl group having 6 to 30 carbon atoms, or an alkoxy group having 1 to 10 carbon atoms.

More specifically, one of $R_8$ and $R_9$ in Chemical Formula 3 is a nitro group, and the other one may be one of hydrogen, an alkyl group having 1 to 10 carbon atoms, an aryl group having 6 to 30 carbon atoms, or an alkoxy group having 1 to 10 carbon atoms.

According to another embodiment of the present disclosure described above, $R_6$ in Chemical Formula 3 is hydrogen, and one of $R_8$ and $R_9$ in Chemical Formula 3 is one of a formyl group, a carboxylic acid group, an amide group having 1 to 10 carbon atoms, an acyl group having 1 to 10 carbon atoms, a ketonyl group having 1 to 10 carbon atoms, an ester group having 1 to 10 carbon atoms, a halogen group, a haloalkyl group having 1 to 10 carbon atoms, a nitro group, a cyano group, a sulfonyl group or a sulfonic acid group, whereby in the compound represented by Chemical Formula 3, an electron withdrawing functional group may be substituted at the second carbon and the fifth carbon of the imidazole compound.

On the other hand, when both $R_8$ and $R_9$ are substituted with an electron withdrawing functional group, the reactivity of the compound represented by Chemical Formula 3 is excessively reduced, curing may not sufficiently proceed even at 200° C. or higher, and thus, the semiconductor manufacturing processability and package reliability can be reduced.

Alternatively, when $R_6$ in Chemical Formula 3 is not hydrogen, based on the above description, $R_9$ in Chemical Formula 3 may be one of a formyl group, a carboxylic acid group, an amide group having 1 to 10 carbon atoms, an acyl group having 1 to 10 carbon atoms, a ketonyl group having 1 to 10 carbon atoms, an ester group having 1 to 10 carbon atoms, a halogen group, a haloalkyl group having 1 to 10 carbon atoms, a nitro group, a cyano group, a sulfonyl group or a sulfonic acid group, and $R_8$ may be one of hydrogen, an alkyl group having 1 to 10 carbon atoms, an aryl group having 6 to 30 carbon atoms, or an alkoxy group having 1 to 10 carbon atoms.

The example of the curing catalyst represented by Chemical Formula 1 is not particularly limited, but for example, the curing catalyst represented by Chemical Formula 1 may include one of the compounds represented by Chemical Formulas 1-1 to 1-5.

[Chemical Formula 1-1]

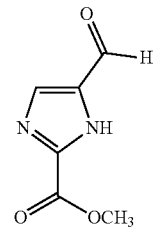

[Chemical Formula 1-2]

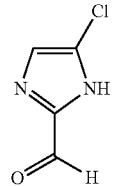

[Chemical Formula 1-3]

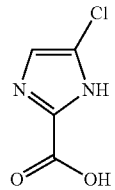

[Chemical Formula 1-4]

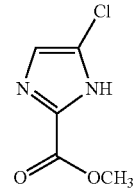

[Chemical Formula 1-5]

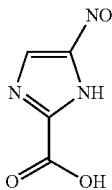

Meanwhile, the curing catalyst represented by Chemical Formula 1 can be reacted with at least one of the thermoplastic resin; the thermosetting resin; or the curing agent at a temperature of 200° C. or higher.

That is, as the curing catalyst represented by Chemical Formula 1 includes at least one functional group represented by Chemical Formula 2 as described above, the reaction rate is controlled, and the reaction is slow at room temperature, thus realizing excellent storage stability, and simultaneously, at a temperature of 200° C. or higher, the reaction with at least one of the thermoplastic resin; the thermosetting resin; or the curing agent is rapidly progressed, thus realizing a technical effect of easily controlling the curing degree.

The resin composition for semiconductor adhesion may include 0.05 parts by weight or more and 15 parts by weight or less of a curing catalyst represented by Chemical Formula 1 based on 100 parts by weight of the resin composition for semiconductor adhesion.

When the resin composition for semiconductor adhesion contains less than 0.05 parts by weight of the curing catalyst represented by Chemical Formula 1 based on 100 parts by weight of the resin composition for semiconductor adhesion, in the thermo-compression bonding step at the time manufacturing a semiconductor package, the curing degree is not secured or a wide reaction temperature section appears, and thus, the rapid curing property of being rapidly cured at a specific temperature may be lost.

When the resin composition for semiconductor adhesion contains more than 15 parts by weight of the curing catalyst represented by Chemical Formula 1 based on 100 parts by weight of the resin composition for semiconductor adhesion, at the time of manufacturing the semiconductor package, some catalysts can be activated even at room temperature before the thermo-compression bonding step to proceed the reaction, which causes a technical problem that storage stability is deteriorated.

The thermoplastic resin may include at least one polymer resin selected from the group consisting of polyimide, polyether imide, polyester imide, polyamide, polyether sulfone, polyether ketone, polyolefin, polyvinyl chloride, phenoxy, reactive butadiene acrylonitrile copolymer rubber and (meth)acrylate resin.

Preferably, as the thermoplastic resin, a (meth)acrylate-based resin having a glass transition temperature of −10 to 30° C. and a weight average molecular weight of 200,000 to 1,000,000 g/mol may be applied.

The acrylic resin is an epoxy group-containing acrylic copolymer, and may include 1 to 25% by weight, or 2 to 20% by weight, or 2.5 to 15% by weight of glycidyl acrylate or glycidyl methacrylate based on the total weight.

Here, when the content of the epoxy group in the (meth)acrylate-based resin is less than 1% by weight, compatibility and adhesive force with epoxy resins are not sufficient. When the content exceeds 25% by weight, the viscosity rise rate due to curing is too high, so that solder bumps may not be sufficiently bonded and embedded in the thermal compression bonding process of the semiconductor device.

The thermoplastic resin may be included in an amount of 10 to 1,500 parts by weight based on 100 parts by weight of the thermosetting resin in consideration of flowability control of the composition during manufacturing of the adhesive film.

The thermosetting resin may include at least one selected from the group consisting of solid epoxy resin and liquid epoxy resin.

Specifically, the epoxy resin may be one or more selected from the group consisting of bisphenol-based epoxy resin, biphenyl-based epoxy resin, naphthalene-based epoxy resin, florene-based epoxy resin, phenol novolac-based epoxy resin, cresol novolac-based epoxy resin, bisphenol novolac-based epoxy resin, biphenyl novolac-based epoxy resin, trishydroxylphenylmethane-based epoxy resin, tetraphenyl-methane-based epoxy resin, dicyclopentadiene-based epoxy resin, and dicyclopentadiene-modified phenol type epoxy resin and an alicyclic epoxy resin.

Here, the bisphenol-based epoxy resin may include bisphenol A-type epoxy resin, bisphenol F-type epoxy resin, bisphenol S-type epoxy resin, hydrogenated bisphenol A-type epoxy resin, bisphenol AF-type epoxy resin, and the like.

When two types of epoxy resins are applied as the thermosetting resin, the epoxy resin which is a liquid at 10 to 35° C. and the epoxy resin which is a solid at 10 to 35° C. can be used by mixing at a weight ratio of 1:0.1 to 1:5.

At this time, when the content of the solid epoxy resin is less than 0.1 weight ratio with respect to the liquid epoxy resin, the resin may excessively flow out in die attach processes, which may cause contamination, and the stickiness of the adhesive layer is strong, which may remarkably reduce the pickup property. On the other hand, when the content of the solid epoxy resin exceeds 5.0 weight ratio with respect to the liquid epoxy resin, it may be disadvantageous in terms of compatibility and reactivity with the thermoplastic resin.

And, the epoxy resin may further include at least one epoxy resin selected from the group consisting of a cresol novolac-type epoxy resin having a softening point of 50° C. to 100° C. and a bisphenol A epoxy resin having a softening point of 50° C. to 100° C (C together with a biphenyl-based epoxy resin having a softening point of 50° C. to 100° C.

At this time, the epoxy resin may include one or more epoxy resins selected from the group consisting of a cresol novolac-type epoxy resin having a softening point of 50° C. to 100° C. and a bisphenol A epoxy resins having a softening point of 50° C. to 100° C. at a weight ratio of 0.25 to 1.25, or 0.3 to 1.1 relative to a biphenyl-based epoxy resin having a softening point of 50° C. to 100° C.

The epoxy resin may have an average epoxy equivalent weight of 100 to 1,000. The average epoxy equivalent weight may be determined based on the weight ratio and epoxy equivalent weight of each epoxy resin contained in the epoxy resin.

The thermosetting resin may be used in an amount of 15 to 80 parts by weight based on 100 parts by weight of the solid content in the total resin composition.

The curing agent may include a phenol resin having a softening point of 70° C. or higher.

For example, a novolac-based phenol resin may be preferably used as the curing agent.

The novolac-based phenol resin has a chemical structure in which a ring is located between reactive functional groups. Due to these structural characteristics, the novolac-based phenol resin can further reduce the hygroscopicity of the adhesive composition, and can further increase the stability in the high-temperature IR reflow process. Thus, it can play a role of preventing peeling phenomenon, reflow cracking, etc. of the adhesive film.

Specific examples of the novolac-based phenolic resins may include one or more selected from the group consisting of novolac phenolic resin, Xylok novolac phenolic resin, cresol novolac phenolic resin, biphenyl novolac phenolic resin, bisphenol A novolac phenolic resin, and bisphenol F novolac phenolic resin.

The novolac-based phenol resin having a softening point of 70° C. or higher is designed to have sufficient heat resistance, strength and adhesiveness after curing of the adhesive composition. However, if the softening point of the novolac-based phenolic resin is too high, the fluidity of the adhesive composition is lowered, and voids are generated inside the adhesive in the actual semiconductor manufacturing process, thereby significantly degrading the reliability or quality of a final product The content of the curing agent may be appropriately selected in consideration of the physical properties of a finally produced adhesive film and the like. For example, the curing agent may be used in an amount of 10 parts by weight or more and 700 parts by weight or less, or 30 parts by weight or more and 300 parts by weight or less based on 100 parts by weight of the resin composition for semiconductor adhesion.

On the other hand, the resin composition for semiconductor adhesion of the embodiment may further include an inorganic filler.

As the inorganic filler, one or more inorganic particles selected from the group consisting of alumina, silica, barium sulfate, magnesium hydroxide, magnesium carbonate, magnesium silicate, magnesium oxide, calcium silicate, calcium carbonate, calcium oxide, aluminum hydroxide, aluminum nitride, and aluminum borate may be applied.

An ion adsorbent that can adsorb ionic impurities to improve reliability can also be used as the inorganic filler. As the ion adsorbent, one or more inorganic particles selected from the group consisting of magnesium types such as magnesium hydroxide, magnesium carbonate, magnesium silicate or magnesium oxide, calcium silicate, calcium carbonate, calcium oxide, alumina, aluminum hydroxide, aluminum nitride, aluminum borate whisker, zirconium-based inorganic material, and antimony bismuth-based inorganic material can be applied.

As the inorganic filler, those having an average particle size (based on the longest outer diameter) of 0.01 to 10 µm, 0.02 to 5.0 µm, or 0.03 to 2.0 µm can be preferably applied. When the particle size of the inorganic filler is too small, it can be easily aggregated in the adhesive composition. On the other hand, when the particle size of the inorganic filler is too large, damage to the semiconductor circuit and deterioration in adhesiveness of the adhesive film may be caused by the inorganic filler.

The content of the inorganic filler may be 10 parts by weight or more and 300 parts by weight or less, or 15 parts by weight or more and 250 parts by weight or less based on 100 parts by weight of the resin composition for semiconductor adhesion.

The resin composition for semiconductor adhesion of the above embodiment may additionally add additives such as a flux, a leveling agent, an antifoaming agent for removing the oxide film of the solder.

Further, the resin composition for semiconductor adhesion may include 10 parts by weight or more and 200 parts by weight or less of an organic solvent based on 100 parts by weight of the resin composition for semiconductor adhesion. The content of the organic solvent may be determined in consideration of the physical properties or the production process of the adhesive composition and the finally produced adhesive film.

The organic solvent may be one or more compounds selected from the group consisting of esters, ethers, ketones, aromatic hydrocarbons, and sulfoxides.

The ester solvent may be ethyl acetate, acetic acid-n-butyl, isobutyl acetate, amyl formate, isoamyl acetate, isobutyl acetate, butyl propionate, isopropyl butyrate, ethyl butyrate, butyl butyrate, methyl lactate, ethyl lactate, gamma-butyrolactone, epsilon-caprolactone, delta-valerolactone, alkyl oxyacetate (e.g., methyl oxyacetate, ethyl oxyacetate, butyl oxyacetate (e.g., methyl methoxyacetate, ethyl methoxyacetate, butyl methoxyacetate, methyl ethoxyacetate, ethyl ethoxyacetate, etc.), 3-oxypropionic acid alkyl ester (e.g., methyl 3-oxypropionate, ethyl 3-oxypropionate, etc. (e.g., methyl 3-methoxypropionate, ethyl 3-methoxypropionate, methyl 3-ethoxypropionate, ethyl 3-ethoxypropionate, etc.), 2-oxypropionic acid alkyl ester (e.g. methyl 2-oxypropionate, ethyl 2-oxypropionate, propyl 2-oxypropionate and the like (e.g., methyl 2-methoxypropionate, ethyl 2-methoxypropionate, propyl 2-methoxypropionate, methyl 2-ethoxypropionate, ethyl 2-ethoxypropionate), methyl 2-oxy-2-methylpropionate and ethyl 2-oxy-2-methylpropionate (e.g., methyl 2-methoxy-2-methylpropionate, ethyl 2-ethoxy-2-methylpropionate, etc.), methyl pyruvate, ethyl pyruvate, propyl pyruvate, methyl acetoacetate, ethyl acetoacetate, methyl 2-oxobutyrate, ethyl 2-oxobutyrate, or the like.

The ether solvent may be diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, or the like.

The ketone solvent may be methyl ethyl ketone, cyclohexanone, cyclopentanone, 2-heptanone, 3-heptanone, N-methyl-2-pyrrolidone, or the like.

The aromatic hydrocarbon solvent may be toluene, xylene, anisole, limonene, or the like.

The sulfoxide solvent may be dimethyl sulfoxide or the like.

In addition, the resin composition for semiconductor adhesion may include a coupling agent. The type of the coupling agent is not particularly limited, but preferably, 2-(3,4-epoxycyclohexyl)ethyltrimethoxysilane, 3-glycidoxypropyltrimethoxysilane, 3-glycidoxypropylmethyl-diethoxysilane, 3-glycidoxypropyltriethoxysilane, N-(2-aminoethyl)-3-aminopropylmethyldimethoxysilane, N-(2-aminoethyl)-3-aminopropyltrimethoxysilane, N-(2-aminoethyl)-3-aminopropyltriethoxysilane, 3-aminopropyltrimethoxysilane, 3-aminopropyltriethoxysilane, 3-triethoxyl-N-(1,3-dimethylbutylidene)propylamine, N-phenyl-3-aminopropyltrimethoxysilane, mercapto-containing 3-mercaptopropylmethyldimethoxysilane, 3-mercaptopropyltrimethoxysilane, or the like can be applied.

II. Adhesive Film for Semiconductor

According to another embodiment of the present disclosure, there is provided an adhesive film for semiconductor comprising a cured product of the above-mentioned resin composition for semiconductor adhesion. The cured product means a material obtained through a curing step of the resin composition for semiconductor adhesion of the one embodiment.

As the adhesive film for semiconductor includes a cured product of the resin composition for semiconductor adhesion of the above-mentioned embodiment, it can exhibit characteristics that can be cured within a short time at high temperature during thermo-compression bonding while exhibiting excellent storage stability at room temperature.

As a supporting substrate for supporting the adhesive film for semiconductor, a resin film having excellent heat resistance and chemical resistance; a crosslinked film obtained by crosslinking a resin constituting the resin film; or a film that has been subjected to a release treatment by applying a silicone resin or the like onto the surface of the said resin film, or the like can be used.

As the resin constituting the resin film, polyolefins such as polyester, polyethylene, polypropylene, polybutene, or polybutadiene, vinyl chloride, ethylene-methacrylic acid copolymer, ethylene vinyl acetate copolymer, polyester, polyimide, polyethylene terephthalate, polyamide, polyurethane, or the like can be applied.

The thickness of the supporting substrate is not particularly limited, but may be 3 to 400 μm, or 5 to 200 μm, or 10 to 150 μm.

The adhesive layer consists of the above-mentioned resin composition for semiconductor adhesion. The details regarding the resin composition for semiconductor adhesion are the same as described above.

Moreover, a pressure-sensitive adhesive layer may be interposed between the supporting substrate and the adhesive layer as needed. As the pressure-sensitive adhesive layer, those known in the art may be applied without particular limitation.

The type of the protective film is not particularly limited, and a plastic film known in the art may be applied. For example, the protective film may be a plastic film containing a resin such as low-density polyethylene, linear polyethylene, medium-density polyethylene, high-density polyethylene, ultra-low density polyethylene, polypropylene random copolymer, polypropylene block copolymer, homopolypropylene, polymethylpentene, ethylene-vinyl acetate copolymer, ethylene-methacrylic acid copolymer, ethylene-methylmethacrylate copolymer, ethylene-ionomer copolymer, ethylene-vinyl alcohol copolymer, polybutene, styrene copolymer, or the like.

The adhesive film for semiconductor may be prepared by a method including mixing the components of the resin composition for semiconductor adhesion, coating the mixture on a supporting substrate to a predetermined thickness to form an adhesive layer, and drying the adhesive layer.

Further, the adhesive film for semiconductor may be prepared by a method including forming an adhesive layer on the supporting substrate and then laminating a protective film on the adhesive layer.

Further, the adhesive film for semiconductor may be prepared by a method including forming a pressure-sensitive adhesive layer on the supporting substrate, and then sequentially laminating an adhesive layer and a protective film on the pressure-sensitive adhesive layer.

As the method for forming an adhesive layer on a supporting substrate, a method of coating the adhesive composition as it is, or diluting it in an appropriate organic solvent and coating it on the supporting substrate or the release film by a known means such as a comma coater, a gravure coater, a die coater, a reverse coater, and the like, and then drying the result at a temperature of 60° C. to 200° C. for 10 seconds to 30 minutes may be used.

If necessary, an aging process may be further performed for progressing a sufficient crosslinking reaction of the adhesive layer.

The thickness of the adhesive layer may be appropriately adjusted in the range of 1 to 500 μm, or 5 to 100 μm, or 5 to 50 μm. The thickness of the adhesive layer is not particularly limited, but for example, it can be freely adjusted within the range of 0.01 μm to 1000 μm.

When the thickness of the adhesive layer increases or decreases by a specific numerical value, the physical properties measured in the adhesive layer may also change by a certain numerical value.

On the other hand, the adhesive film for semiconductor of the one embodiment may have a melt viscosity of 6000 Pa·s or less, 4000 Pa·s or more and 6000 Pa·s or less, 4000 Pa·s or more and 5900 Pa·s or less, 4200 Pa·s or more and 5813 Pa·s or less, 4200 Pa·s or more and 5000 Pa·s or less, 4200 Pa·s or more and 4900 Pa·s or less, 4500 Pa·s or more and 4900 Pa·s or less, or 4800 Pa·s or more and 4900 Pa·s or less. Specifically, the melt viscosity may be the viscosity value of the lowest numerical value of the measured value measured by using the advanced rheometric expansion system (ARES) of TA Corporation, with respect to a laminated specimen after laminating and laminating the adhesive film for semiconductors of one embodiment described above.

When the melt viscosity of the adhesive film for semiconductor exceeds 6000 Pa·s, a technical problem may occur in which voids are liable to remain in the semiconductor package to which the adhesive film is applied.

Meanwhile, the adhesive film for semiconductor of the one embodiment may have a DSC onset temperature of 185° C. or higher, 185° C. or higher and 250° C. or lower, 190° C. or higher and 220° C. or lower, 195° C. or higher and 213° C. or lower, 200° C. or higher and 213° C. or lower, 205° C. or higher and 213° C. or lower, or 210° C. or higher and 213° C. or lower. Specifically, the DSC onset temperature may be measured using a differential thermal analyzer (DSC), and it may be the temperature at the intersection between the tangent line of the portion where an initial reaction peak starts to be formed and the extrapolation of the baseline. Further, the DSC onset temperature may mean a curing start temperature.

When the DSC onset temperature of the adhesive film for semiconductor is less than 185° C., curing may start at a low temperature, which may cause a technical problem that it is difficult to control the curing degree.

Preferably, the adhesive film for semiconductor of the one embodiment may have a melt viscosity of 6000 Pa·s or less, and at the same time, a DSC onset temperature of 185° C. or higher. That is, as the adhesive film for semiconductor of the one embodiment has a high DSC onset temperature of 185° C. or higher, a fine reaction is not substantially shown in the temperature range of the drying process during coating, and thereby, it can have a low melting point viscosity of 6000 Pa·s or less.

As the adhesive film for semiconductors of the one embodiment has a melt viscosity of 6000 Pa·s or less, and at the same time, a DSC onset temperature of 185° C. or higher, not only voids do not remain in the semiconductor package to which the adhesive film is applied, but also it is possible to implement technical effects that can easily control the curing degree of the adhesive film for semiconductor.

III. Method for Manufacturing Semiconductor Package

According to yet another embodiment of the present disclosure, there can be provided a method for manufacturing a semiconductor package comprising the step of subjecting a substrate on which an adhesive film for a semiconductor is laminated; and a semiconductor substrate to thermo-compression bonding.

Specifically, the thermo-compression bonding process is preferably performed within a short time by applying a constant pressure at a high temperature of 120° C. or higher.

Preferably, the thermo-compression bonding may be performed at a temperature of 120° C. or higher, 120° C. or higher and 300° C. or lower, or 200° C. or higher and 300° C. or lower.

If the temperature is 300° C. or higher, there is a problem that the non-conductive film is thermally decomposed and outgas is generated.

Further, the thermo-compression bonding may be performed for 0.5 second to 10 seconds, or 1 second to 15 seconds under a pressure condition of 10 N to 300 N, or 50 N to 250 N.

Further, if the pressure during the thermo-compression bonding is 10N or less, there is a problem that connection between the bump and the pad is difficult. Further, if the pressure is 300N or more, there is a risk that the bump may be damaged or the chip may be broken.

Further, before the thermo-compression bonding step performed at a high temperature of 120° C. or higher, the step of performing a temporary bonding at a temperature of 50° C. to 150° C. for 0.1 second to 10 seconds may be performed.

Further, before the thermo-compression bonding step, a step of removing a pressure-sensitive adhesive layer of the adhesive film for semiconductor can be further included. In this thermo-compression bonding process, a partially cured adhesive film for semiconductor is used, so that voids or resin-insertion are not generated, and fillets are minimized, thereby manufacturing a semiconductor package with improved reliability.

The preparation of the substrate on which an adhesive film for a semiconductor is laminated can be performed by vacuum laminating the adhesive film for semiconductor on a substrate. That is, the method for manufacturing a semiconductor package according to the one embodiment may further include a step of laminating an adhesive film for semiconductor to the substrate before the thermo-compression bonding step.

Preferably, in the present disclosure, the step of laminating the adhesive film for a semiconductor on the surface is preferably performed at 40 to 130° C. or 40 to 100° C. under vacuum conditions. At this time, during the vacuum lamination, if the temperature is 40° C. or less, there is a problem that the fluidity of the film is low and thus the gaps between bumps are not be filled. If the temperature is 130° C. or higher, there is a problem in that thermal curing occurs during lamination and the melt viscosity increases, so that filling properties are not exhibited. That is, when a material for semiconductor sealing is vacuum-laminated on a bump substrate, the use of the adhesive film for semiconductor allows the fine pitch bumps to be effectively buried at the lamination temperature.

After the step of laminating the adhesive film for semiconductor on the substrate, the method may further include irradiating ultraviolet rays to the substrate on which an adhesive film for a semiconductor is laminated.

The step of irradiating the substrate on which an adhesive film for a semiconductor is laminated with ultraviolet rays is performed at a light amount of 0.1 to 1000 mJ/cm$^2$. That is, the above step uses UV having a constant wavelength band and differs depending on the height of the bumps, the thickness of the non-conductive film, the thickness of the substrate film and the adhesive layer, but it is preferable to irradiate with ultraviolet light using a light amount of 0.1 to 1000 mJ/cm$^2$ or 100 to 1000 mJ/cm$^2$ or 300 to 800 mJ/cm$^2$.

Further, in the present disclosure, in addition to the configuration using the adhesive film for semiconductor described above, a conventional packaging process can be performed.

For example, the packaging process includes: a wafer testing process during which defective semiconductor chips are inspected; a dicing process in which a wafer is cut into individual chips; a die bonding process wherein the separate chips are attached to a mounting board of a circuit film or lead frame; a wire bonding process wherein a chip pad provided on a semiconductor chip is connected with a circuit pattern of the circuit film or lead frame via electrical connecting means such as wire; and the like. At this time, before the dicing process, back grinding process for thinning a substrate (wafer) to a desired thickness may be performed.

IV. Semiconductor Package

In addition, the present disclosure provides a semiconductor package comprising the above-mentioned adhesive film for semiconductor.

The adhesive film for semiconductor may be introduced into the semiconductor package by the semiconductor package manufacturing method described above. The adhesive film for semiconductor may include a cured product of the resin composition for semiconductor adhesion of the one embodiment.

The adhesive film for semiconductor is manufactured from the resin composition for semiconductor adhesion of the one embodiment, and can realize excellent storage stability at room temperature while being curable within a short period of time at high temperature.

In addition, since the semiconductor package of the one embodiment includes the above-mentioned adhesive film for semiconductors, and thus, can realized excellent package reliability.

Advantageous Effects

According to the present disclosure, an adhesive composition for semiconductor circuit connection having excellent storage stability at room temperature while being curable within a short time at high temperature during a thermo-compression bonding, an adhesive film for semiconductor, a method for manufacturing a semiconductor package, and a semiconductor package using the same can be provided.

DETAILED DESCRIPTION OF THE EMBODIMENTS

Hereinafter, specific embodiments of the present disclosure will be described in more detail by way of examples. However, these examples are merely to illustrate specific embodiments of the present disclosure, and are not intended to limit the scope of the present disclosure.

EXAMPLE, COMPARATIVE EXAMPLE AND REFERENCE EXAMPLE: PREPARATION OF RESIN COMPOSITION FOR SEMICONDUCTOR ADHESION, ADHESIVE FILM AND SEMICONDUCTOR PACKAGE

Example 1

(1) Preparation of Resin Composition for Semiconductor Adhesion

As shown in Table 1 below, 40 g of phenol resin KH-6021 (produced by DIC Corp., bisphenol A novolac resin), which is a curing agent for epoxy resin; 30 g of epoxy resin RE-310S (produced by Nippon Kayaku Co., Ltd., bisphenol A epoxy resin); 35 g of YDCN-500-5P (Kukdo Chemical, cresol novolac epoxy resin), 15 g of thermoplastic acrylate resin KG-3015 (Mw: 900,000, glass transition temperature: 10° C.); 1.5 g of a compound represented by the following Chemical Formula A as a curing catalyst; Ig of flux and 80 g of inorganic filler SC-2050 (Admatec, spherical silica) were mixed in a methyl ethyl ketone to obtain a resin composition for semiconductor adhesion (solid content: 45 wt % concentration).

[Chemical Formula A]

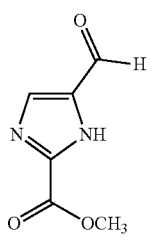

(2) Preparation of Adhesive Film

The above-prepared adhesive composition was coated onto a release-treated polyethylene terephthalate film (thickness 38 μm) using a comma coater and then dried at 110° C. for 3 minutes to obtain an adhesive film in which an adhesive layer with a thickness of about 20 μm was formed.

(3) Manufacture of Semiconductor Package

A wafer containing bump chips (4.5 mm×4.5 mm), which is a semiconductor device in which lead-free solder (SnAgCu) was formed at a height of 3 μm on a copper filler having a height of 15 μm and a pitch of 50 μm, was prepared.

The adhesive layer of the adhesive film was set to be located on the bump surface of the wafer, and vacuum lamination was performed at 50° C., and then singulated into chips.

The singulated bump chip were bonded by thermal compression onto a 6 mm×8 mm substrate chip having a connection pad (pitch 50 μm) using a thermal compression bonder. At this time, the conditions were as follows: temporally bonded under 100N for 2 seconds at a head temperature of 100° C. and allowed to stand at 100° C. for 10 minutes, and then the head temperature was instantaneously increased to 260° C., and thermal compression bonding was performed under 100 N for 4 seconds.

Example 2

A resin composition for semiconductor adhesion, an adhesive film and a semiconductor package were prepared in the same manner as in Example 1, except that a compound represented by the following Chemical Formula B was used as a curing catalyst as shown in Table 1 below.

[Chemical Formula B]

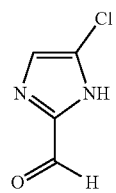

Example 3

A resin composition for semiconductor adhesion, an adhesive film and a semiconductor package were prepared in the same manner as in Example 1, except that a compound represented by the following Chemical Formula C was used as a curing catalyst as shown in Table 1 below.

[Chemical Formula C]

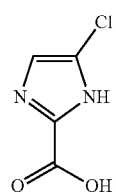

Example 4

A resin composition for semiconductor adhesion, an adhesive film and a semiconductor package were prepared in the same manner as in Example 1, except that a compound represented by the following Chemical Formula D was used as a curing catalyst as shown in Table 1 below.

[Chemical Formula D]

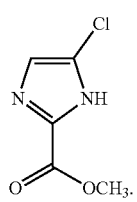

Example 5

A resin composition for semiconductor adhesion, an adhesive film and a semiconductor package were prepared in the same manner as in Example 1, except that a compound represented by the following Chemical Formula E was used as a curing catalyst as shown in Table 1 below.

[Chemical Formula E]

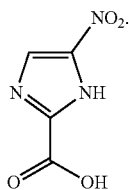

Comparative Example 1

A resin composition for semiconductor adhesion, an adhesive film and a semiconductor package were prepared in the same manner as in Example 1, except that a compound (2,5-chloro-4-ethylimidazole) represented by the following Chemical Formula F was used as a curing catalyst as shown in Table 2 below.

[Chemical Formula F]

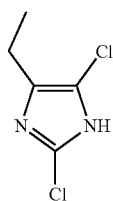

Comparative Example 2

A resin composition for semiconductor adhesion, an adhesive film and a semiconductor package were prepared in the same manner as in Example 1, except that a compound (2,5-bis(4-chlorophenyl)-1H-imidazole) represented by the following Chemical Formula G was used as a curing catalyst as shown in Table 2 below.

[Chemical Formula G]

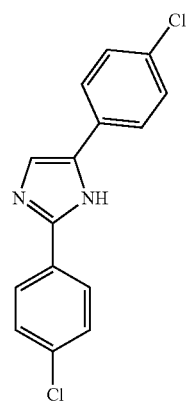

Comparative Example 3

A resin composition for semiconductor adhesion, an adhesive film and a semiconductor package were prepared in the same manner as in Example 1, except that a compound (3,3'-(1H-imidazole-2,5-diyl)dipropanenitrile) represented by the following Chemical Formula H was used as a curing catalyst as shown in Table 2 below.

[Chemical Formula H]

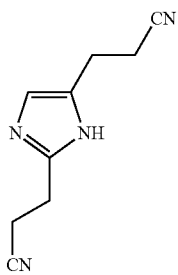

Comparative Example 4

A resin composition for semiconductor adhesion, an adhesive film and a semiconductor package were prepared in the same manner as in Example 1, except that a compound represented by the following Chemical Formula I was used as a curing catalyst as shown in Table 2 below.

[Chemical Formula I]

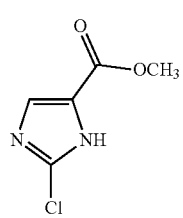

Reference Example 1

A resin composition for semiconductor adhesion, an adhesive film and a semiconductor package were prepared in the same manner as in Example 1, except that a compound represented by the following Chemical Formula J was used as a curing catalyst as shown in Table 2 below.

[Chemical Formula J]

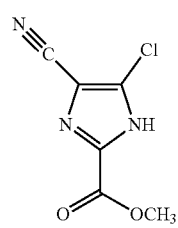

TABLE 1

| | Weight (g) | Example 1 | Example 2 | Example 3 | Example 4 | Example 5 |
|---|---|---|---|---|---|---|
| Phenol resin | KH-6021 | 40 | 40 | 40 | 40 | 40 |
| Epoxy resin | RE-310S | 30 | 30 | 30 | 30 | 30 |
| | YDCN-500-5P | 35 | 35 | 35 | 35 | 35 |
| Acryl resin | KG-3015 | 15 | 15 | 15 | 15 | 15 |
| Catalyst | Compound A | 1.5 | — | — | — | — |

TABLE 1-continued

| Weight (g) | | Example 1 | Example 2 | Example 3 | Example 4 | Example 5 |
|---|---|---|---|---|---|---|
| | Compound B | — | 1.5 | — | — | — |
| | Compound C | — | — | 1.5 | — | — |
| | Compound D | — | — | — | 1.5 | — |
| | Compound E | — | — | — | — | 1.5 |
| Filler | SC-2050 | 80 | 80 | 80 | 80 | 80 |

TABLE 2

| | Weigh (g) | Comparative Example 1 | Comparative Example 2 | Comparative Example 3 | Comparative Example 4 | Reference Example 1 |
|---|---|---|---|---|---|---|
| Phenol resin | KH-6021 | 40 | 40 | 40 | 40 | 40 |
| Epoxy resin | RE-310S | 30 | 30 | 30 | 30 | 30 |
| | YDCN-500-5P | 35 | 35 | 35 | 35 | 35 |
| Acryl resin | KG-3015 | 15 | 15 | 15 | 15 | 15 |
| Catalyst | Compound F | 1.5 | — | — | — | — |
| | Compound G | — | 1.5 | — | — | — |
| | Compound H | — | — | 1.5 | — | — |
| | Compound I | — | — | — | 1.5 | — |
| | Compound J | — | — | — | — | 1.5 |
| Filler | SC-2050 | 80 | 80 | 80 | 80 | 80 |

*KH-6021: phenol resin (DIC, hydroxyl equivalent weight: 121 g/eq, softening point: 133° C.)
*RE-310S: epoxy resin (Nippon Kayaku, epoxy equivalent weight: 180 g/eq)
*YDCN-500-5P: epoxy resin (Kukdo Chemical, cresol novolac epoxy resin)
*KG-3015: acrylate-based resin (including 3 wt % of glycidyl methacrylate repeating unit, glass transition temperature: 10° C., weight average molecular weight: 900,000)
*SC-2050: filler (Admatec, spherical silica, average particle size: about 400 nm)

Experimental Example: Physical Property Evaluation

Test Example (1) Measurement of Melt Viscosity

The adhesive layers respectively obtained in Examples, Comparative Examples and Reference Example were overlapped and laminated until the thickness became 320 μm, and then laminated using a roll laminator at 60° C. Then, each specimen was molded into a circular shape having a diameter of 8 mm, and then applied to a temperature rise rate of 10° C./min at a shear rate of 5 rad/s using TA Instruments ARES (advanced rheometric expansion system), and the viscosity value of the lowest measured numerical value was judged as melt viscosity.

(2) DSC Onset Evaluation

For the adhesive films obtained in Examples, Comparative Examples, and Reference Example, the measurement was performed at a rate of 10° C./min in a range of 30 to 300° C. using a differential scanning calorimetry (DSC), and the temperature at the intersection between the tangent line of the portion where an initial reaction peak starts to be formed and the extrapolation of the baseline was designated as onset, and this was designated as the curing start temperature.

(3) Evaluation of Voids

The semiconductor packages respectively obtained in Examples, Comparative Examples and Reference Example were observed using a Scanning Acousitic Tomography (SAT), and was evaluated as either "acceptable" (O) if the area of voids between the bump chip and the substrate chip was no greater than 1%, or "unacceptable" (X) if it was greater than 1%.

(4) Electrical Evaluation

The semiconductor packages respectively obtained in Examples, Comparative Examples and Reference Example were evaluated as either "acceptable" (O) if daisy chain connection could be confirmed, or "unacceptable" (X) if daisy chain connection could not be confirmed.

(5) Evaluation of Connection Condition

The connecting part in the semiconductor packages respectively obtained in Examples, Comparative Examples and Reference Example was exposed by cross-sectional polishing, and observed using an optical microscope. An evaluation of "acceptable" (O) was assigned if no trapping was seen in the connecting part and the solder had sufficiently wetted the wiring, while otherwise an evaluation of "unacceptable" (X) was assigned.

(6) Evaluation of Room-Temperature Stability with Time

The adhesive films respectively obtained in Examples, Comparative Examples and Reference Example were allowed to stand at 25° C., and then the ΔH peak change amount was calculated using a differential thermal analyzer (DSC) on a daily basis, and the variation in the minimum melt viscosity was calculated by the above method for measuring the minimum melt viscosity. When the change rate in the case of the ΔH peak was changed by more than 20% or when the change rate in the case of the minimum melt viscosity was changed by 50% or more, it was judged that there was a change with time. It was evaluated as either "acceptable" (O) if there was a change over 4 weeks, or "unacceptable" (X) if there was a change within 4 weeks.

(7) Evaluation of Stage Stability

When the adhesive films respectively obtained in Examples, Comparative Examples and Reference Example were subjected to isothermal experiments at 80° C. by a differential thermal analysis(DSC) for 8 hours and 24 hours, respectively, the variation of ΔH peak was calculated. An evaluation of "acceptable" (O) was assigned if the change rate from the existing ΔH peak was 2% or less and 10% or less at the same time, while otherwise an evaluation of "unacceptable" (X) was assigned.

TABLE 3

|                                      | Example 1 | Example 2 | Example 3 | Example 4 | Example 5 |
|---|---|---|---|---|---|
| Melt viscosity (Pa · s)              | 4874      | 5813      | 4256      | 4537      | 4640      |
| DSC onset (° C.)                     | 213       | 198       | 204       | 205       | 195       |
| Voids                                | ○         | ○         | ○         | ○         | ○         |
| Electrical                           | ○         | ○         | ○         | ○         | ○         |
| Connection condition                 | ○         | ○         | ○         | ○         | ○         |
| Room-temperature stability with time | ○         | ○         | ○         | ○         | ○         |
| Stage stability                      | ○         | ○         | ○         | ○         | ○         |

TABLE 4

|                                      | Comparative Example 1 | Comparative Example 2 | Comparative Example 3 | Comparative Example 4 | Reference Example 1 |
|---|---|---|---|---|---|
| Melt viscosity (Pa · s)              | 5712 | 4831 | 3985 | 4537 | 848 |
| DSC onset (° C.)                     | 147  | 143  | 155  | 181  | 242 |
| Voids                                | ○    | ○    | ○    | ○    | X   |
| Electrical                           | ○    | ○    | ○    | ○    | X   |
| Connection condition                 | ○    | ○    | ○    | ○    | X   |
| Room-temperature stability with time | X    | X    | X    | ○    | —   |
| Stage stability                      | X    | X    | X    | X    | —   |

As shown in Tables 3 and 4 above, it was confirmed that the adhesive films for semiconductors provided in Examples 1 to 5 exhibited a high DSC onset temperature while having an equivalent level of the melt viscosity. Further, in the semiconductor devices to which the adhesive films of Examples 1 to 5 were applied, it was confirmed that voids did not substantially remain, the ΔH peak change amount was low while being left for 10 minutes after temporary bonding at 100° C., so that no change with the lapse of time occurred, and neither electrical failure nor connection condition failure occurred.

On the contrary, in the semiconductor devices to which the adhesive films of Comparative Examples 1 to 4 were applied, it was confirmed that not only change with the lapse of time occurred while being left for 10 minutes after temporary bonding at 100° C., but also the reaction proceeded rapidly even when stored at room temperature, and a change with the lapse of time occurred within 4 weeks.

In addition, it was confirmed that the adhesive film of Reference Example 1 hardly cured, and the phenomenon in which the bonded chips fell off easily occurred. Consequently, the electrical failure and the connection condition failure occurred, and further experiments were impossible.

The invention claimed is:

1. A resin composition for semiconductor adhesion comprising: a thermoplastic resin; a thermosetting resin; a curing agent; and a curing catalyst,

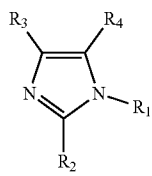

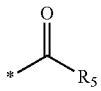

wherein the curing catalyst includes at least one compound selected from the compounds represented by Chemical Formulae 1-1 to 1-5:

[Chemical Formula 1-1]

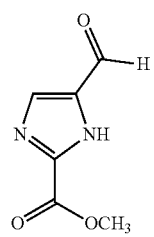

[Chemical Formula 1-2]

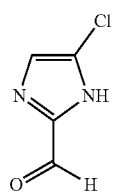

[Chemical Formula 1-3]

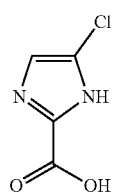

-continued

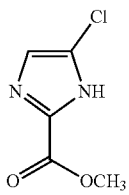
[Chemical Formula 1-4]

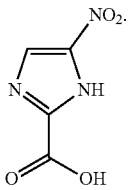
[Chemical Formula 1-5]

2. The resin composition for semiconductor adhesion of claim 1, wherein the curing catalyst functions to react with at least one of the thermoplastic resin; the thermosetting resin; and the curing agent at a temperature of 200° C. or higher.

3. The resin composition for semiconductor adhesion of claim 1, comprising 0.05 parts by weight or more and 15 parts by weight or less of the curing catalyst based on 100 parts by weight of the resin composition for semiconductor adhesion.

4. The resin composition for semiconductor adhesion of claim 1, wherein the thermosetting resin includes at least one resin selected from solid epoxy resin and liquid epoxy resin.

5. The resin composition for semiconductor adhesion of claim 1, wherein the thermoplastic resin includes at least one polymer resin selected from polyimide, polyether imide, polyester imide, polyamide, polyether sulfone, polyether ketone, polyolefin, polyvinyl chloride, phenoxy, reactive butadiene acrylonitrile copolymer rubber and (meth)acrylate resin.

6. The resin composition for semiconductor adhesion of claim 1, wherein the curing agent includes a phenol resin having a softening point of at least 70° C.

7. An adhesive film for semiconductor comprising a cured product of the resin composition for semiconductor adhesion of claim 1.

8. The adhesive film for semiconductor of claim 7, wherein the adhesive film has a melt viscosity of 6000 Pa·s or less.

9. The adhesive film for semiconductor of claim 7, wherein the adhesive film has a DSC onset temperature of at least 185° C.

10. A method for manufacturing a semiconductor package comprising the step of thermo-compression bonding a substrate on which the adhesive film for a semiconductor of claim 7 is laminated; with a semiconductor substrate.

11. The method for manufacturing a semiconductor package of claim 10, wherein the thermo-compression bonding step is performed at a high temperature of at least 120° C.

12. A semiconductor package comprising the adhesive film for semiconductor of claim 7.

* * * * *